United States Patent [19]

Dixon et al.

[11] 4,124,826
[45] Nov. 7, 1978

[54] CURRENT CONFINEMENT IN SEMICONDUCTOR LASERS

[75] Inventors: Richard W. Dixon, Bernardsville; Louis A. Koszi, Scotch Plains; Franklin R. Nash, Griggstown, all of N.J.

[73] Assignee: Bell Telephone Laboratories, Incorporated, Murray Hill, N.J.

[21] Appl. No.: 773,320

[22] Filed: Mar. 1, 1977

[51] Int. Cl.² ............................................. H01S 3/19
[52] U.S. Cl. ............................. 331/94.5 H; 148/1.5; 148/186; 148/187; 357/65; 357/18
[58] Field of Search ............... 331/94.5 H; 357/18, 357/17, 16, 65, 71; 148/1.5, 186, 187

[56] References Cited

U.S. PATENT DOCUMENTS 3,824,133  7/1974  D'Asaro ........................... 148/1.5
3,936,322  2/1976  Blum et al. ...................... 331/94.5 H Primary Examiner—Stanley D. Miller, Jr.
Assistant Examiner—James W. Davie
Attorney, Agent, or Firm—Michael J. Urbano

[57] ABSTRACT

Current confinement in semiconductor devices by means of buried high resistivity zones is described. For example, in a stripe geometry, semiconductor, junction laser the laterally separate, high resistivity zones, which confine current flow in a narrow channel between the upper and lower electrical contacts, are buried below the upper contact. This configuration permits current to flow from the upper contact into the body of the semiconductor over greatly increased area before it enters the channel. The current density at the interface between the upper contact and the semiconductor body is thereby reduced, making the quality of that interface less important. Several processes which employ proton bombardment for fabricating the laser are also described: (1) in one the normal sequence of Zn diffusion and proton bombardment is reversed, and (2) in the other the profiles of Zn doping and proton damage are suitably tailored.

5 Claims, 3 Drawing Figures

CURRENT CONFINEMENT IN SEMICONDUCTOR LASERS

BACKGROUND OF THE INVENTION

This invention relates to semiconductor devices, and, more particularly, to stripe geometry junction lasers.

The stripe geometry semiconductor junction laser was first proposed by R. A. Furnanage and D. K. Wilson (U.S. Pat. No. 3,363,195 issued Jan. 9, 1968) as a means to reduce the number of lasing modes. The stripe geometry also reduces the threshold current for lasing and limits the spatial width of the output beam. Since that early proposal, numerous laser configurations have been devised to implement the stripe geometry concept: (1) the oxide stripe laser, J. C. Dyment et al, *Appl. Phys. Let.*, Vol. 10, pp 84–86 (1967); (2) the proton bombarded stripe laser, L. A. D'Asaro et al, U.S. Pat. No. 3,824,133 issued on July 16, 1974; (3) the mesa stripe laser, T. Tsukada et al, *Appl. Phys. Let.*, Vol. 20, pp. 344–345 (1972) and R. A. Logan et al, U.S. Pat. No. 3,833,435 issued on Sept. 3, 1974; (4) the reversed biased p-n junction isolation laser, H. Yonezu et al, Japan JAP, Vol. 12, pp 1582–1592 (1973); K. Itoh et al, *IEEE JQE*-11, 421 (1975); G. H. B. Thompson, U.S. Pat. No. 3,780,358 issued on Dec. 18, 1973; R. B. Burnham et al U.S. Pat. No. 3,984,262 issued on Oct. 5, 1976; (5) rib-waveguide lasers, S. E. Miller, U.S. Pat. No. 3,883,821 issued on May 13, 1975; and (6) buried heterostructures of various types, T. Tsukada, *J. Appl. Phys.*, Vol. 45, p. 4899 (1974); T. P. Lee et al, *Appl. Phys. Let.*, Vol. 29, p. 164 (1976) and M. Takusagawa et al, Proc. *IEEE Let.*, Vol. 61, p. 1758 (1963).

The most commonly used configuration for the past seven years, however, has been the proton bombarded, GaAs-AlGaAs double heterostructure (DH) laser. Despite its various shortcomings, lasers of this type have regularly exhibited lifetimes in excess of 10,000 hours and a number have exceeded 100,000 hours (based on accelerated aging tests).

One of the shortcomings of this structure relates to the fabrication of electrical metal contacts to the semiconductor body, in particular the contact to the proton bombarded semiconductor surface. By suitable masking, proton bombardment forms laterally separate, high resistivity zones which bound a narrow (typically 12 $\mu$m), low resistivity stripe-like channel under the mask and which extend longitudinally between the laser mirrors. Since forward bias current is constrained by the proton-bombarded zones to flow through the narrow stripe-like channel, and since current densities in these devices are rather high (typically 2000 A/cm$^2$), a very good metal-semiconductor contact is required at this surface (e.g., a specific contact resistivity of about $10^{-5}$ $\Omega$ cm$^2$ or less is desirable). The fabrication of a contact of this high quality has been one of the dominant obstacles to the attainment of reproducible, high yield, reliable lasers. Indeed, this problem may become even more severe as narrower (e.g., 8 $\mu$m) stripes are contemplated as a means of enhancing control of filamentary lasing. See Dixon et al, *APL*, 29, 372 (1976).

SUMMARY OF THE INVENTION

We have alleviated this problem in junction lasers by positioning the high resistivity zones so that they are separated from the upper semiconductor surface and contact by a low resistivity zone; that is, the high resistivity zones are buried beneath the upper surface of the semiconductor body. This configuration permits current to flow from the upper contact into the semiconductor body (i.e., into the low resistivity zone) over a greatly increased area, making the quality of the metal contact-to-semiconductor body interface less important to the production of high yield, reproducible, reliable lasers. Once inside the semiconductor body, the current flows laterally in the low resistivity zone into the stripe-like channel where the active region of the laser is typically located. Stimulated emission from the active region occurs in the usual fashion.

Although the foregoing discussion formulates the contact problem and solution with respect to junction laser technology, in a broader aspect our invention relates to any high current density semiconductor device which operates by constraining current to flow through a narrow channel by means of laterally separate, high resistivity zones bounding that channel. Of course, the channel need not be a rectangular stripe as in the laser but may take on other geometric shapes. According to this aspect of our invention, therefore, a semiconductor device comprises: a semiconductor body, an electrical contact to a major surface of the body, a narrow channel in the body through which electrical current is to flow from the contact, a pair of laterally spaced, high resistivity zones bounding the narrow channel for confining current flow to the channel, characterized in that the high resistivity zones are vertically spaced from the contact by a low resistivity zone, thereby to reduce the current density at the interface between the contact and the semiconductor body.

In a specific exemplary embodiment of our invention, the semiconductor device is a stripe geometry GaAs-AlGaAs DH p-n junction laser in which the stripe is delineated by proton bombardment. However, as mentioned previously, the high resistivity, proton bombarded zones are vertically separated from (i.e., buried beneath) the contact by a low resistivity zone so that current enters the semiconductor body over a greatly increased area. This feature of our invention is applicable to other forms of junction lasers as well, e.g., homostructures, single heterostructures and separate confinement heterostructures.

In accordance with another aspect of our invention the buried, high resistivity zones are formed by reversing the order of two steps in the standard fabrication sequence; that is, after epitaxial growth is completed, proton bombardment is done before Zn diffusion of the uppermost epi-layer. It was not obvious that this reversed sequence could result in a device with well defined current flow. In fact, the times and temperatures of the Zn diffusion cycle are such that the relevant literature [J. C. Dyment et al, *J. Appl. Phys.*, Vol. 44, p. 207 (1973) and the D'Asaro patent supra] suggest that the effectiveness of the proton bombardment in producing current confinement would be destroyed by a subsequent Zn diffusion. We have found experimentally that this is not the case.

BRIEF DESCRIPTION OF THE DRAWING

Our invention, together with its various features and advantages, can be readily understood from the following more detailed description taken in conjunction with the accompanying drawing in which.

DETAILED DESCRIPTION

Figure 1:
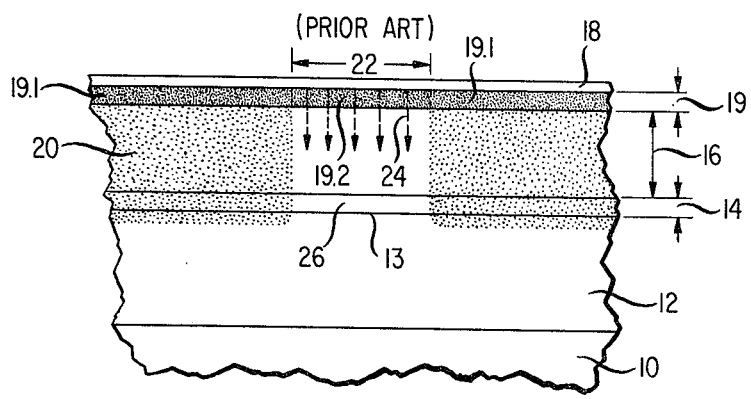
FIG. 1 is a schematic end view of a prior art stripe geometry junction laser formed by proton bombardment.

Before discussing our invention in detail, it will be helpful to review first the structure and fabrication of a conventional prior art, stripe geometry junction laser as depicted in FIG. 1 (see D'Asaro et al, U.S. Pat. No. 3,824,133). This type of laser typically comprises an n-GaAs substrate 10 on which are epitaxially grown (usually by LPE) the following layers in the order recited: an n-Al$_x$Ga$_{1-x}$As ($0 \leq x \leq 0.1$) wide bandgap cladding layer 12, a narrower bandgap p-GaAs active layer 14, a p-Al$_y$Ga$_{1-y}$As ($0 \leq y \leq 1$) wide bandgap cladding layer 16 (typically $0.24 \leq x, y \leq 0.36$). Optionally, a p-GaAs cap layer (not shown) is formed on layer 16 to facilitate electrical contacting. In either case a high conductivity layer 19 is formed in the uppermost epitaxial layer by diffusing a high concentration of acceptor atoms therein. Typically, Zn is diffused to a depth of about 0.2 μm and to a concentration of about 10$^{20}$/cm$^3$.

Of course, it is well known that the active layer 14 may include some Al (i.e., Al$_z$Ga$_{1-z}$As; $0 \leq z \lesssim 0.4$) in which case $z < x,y$ and illustratively $0 \leq z \leq 0.1$. Moreover, a small amount of P can be included in the layers to form AlGaAsP as described in U.S. Pat. Nos. 3,958,263 issued on May 18, 1976 to M. B. Panish et al and 3,962,716 issued on June 8, 1976 to P. Petroff et al. Its conductivity need not be p-type. Thus, active layer 14 may be compensated, n-type or both n- and p-types.

Before depositing or otherwise forming metallic electrical contact 18 on the uppermost epitaxial layer (i.e., on the epitaxial layer which has been subjected to the Zn skin diffusion), the upper surface is suitably masked to define a narrow stripe-like channel 22 which extends along the length of the laser; i.e., along the axis of the laser resonator formed by spaced, parallel, cleaved facets which lie parallel to the plane of the paper of FIG. 1. Once masked, the upper surface is subjected to proton bombardment at a suitable dose and energy to damage the semiconductor crystal in the unmasked areas down to a depth near to, or through the p-n junction 13 formed at the interface between layers 12 and 14. This step forms laterally separate, high resistivity zones 20 which bound the narrow stripe-like channel 22 along the length of the laser. In addition, the zones 20 extend vertically from a plane near to or slightly below p-n junction 13 to the upper surface of Zn-diffused layer 19. In accordance with standard fabrication procedures the proton bombardment damage is sufficient to convert the portions 19.1 of high conductivity layer 19 outside stripe-like channel 22 into relatively high resistivity material. The portion 19.2, however, remains low resistivity material.

Finally the contact 18 is formed on layer 19 and a suitable contact (not shown) is formed on the opposite major surface of substrate 10. For continuous wave operation at room temperature the following conditions are desirable: the active layer 14 should be less than 1.0 μm thick, and preferably about 0.15 μm; and the contact 18 should be bonded or otherwise coupled to a suitable heat sink. Forward bias current above threshold (e.g., about 100–150 mA for a laser about 300–500 μm in length) is applied between the contacts. Because zones 20 are of much higher resistivity than stripe-like channel 22, current entering contact 18 is constrained to flow into the narrow channel 22 which is typically about 12 μm wide. This current, which is depicted by arrows 24, pumps the active region defined by the portion 26 of active layer 14 which is bounded by zones 20. Recombination of holes and electrons within active region 26 results in stimulated emission emanating therefrom.

Because the pumping current is constrained by the zones 20 to flow in the narrow stripe-like channel 22, and further because the current density in this type of laser is rather high (typically 2,000 A/cm$^2$), a very good metal-semiconductor contact 18 is required. For example, a specific contact resistivity of about $10^{-5}$ Ω cm$^2$ or less is desirable. The attainment of contact 18 of such high quality has been one of the dominant obstacles in the fabrication of reproducible, high yield, reliable lasers of this type. The problem would be further exacerbated if narrower stripe regions 22 were utilized, for example, to control filamentary lasing.

We have found that the high quality demand placed upon contact 18 can be considerably mitigated by burying the high resistivity, proton bombarded zones beneath the upper surface of the semiconductor body so that these zones are separated from the upper surface by a low resistivity zone. This configuration permits current to flow from contact 18 into the semiconductor body over a greatly increased area thereby making the quality of the interface between contact 18 and the semiconductor less critically important to the operation of the laser.

Figure 2:
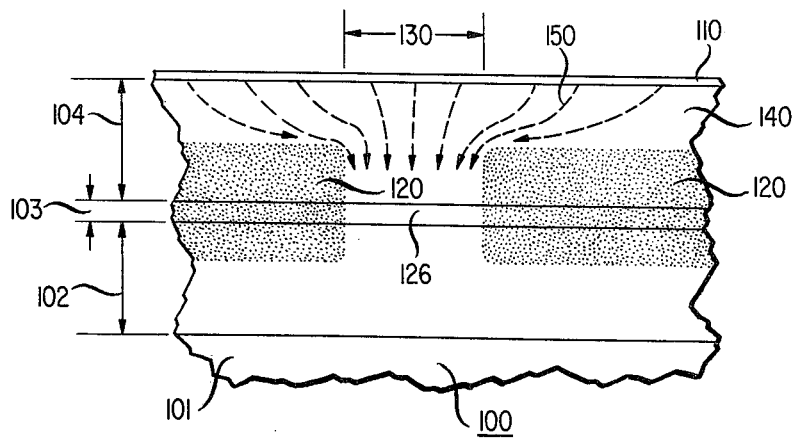
FIG. 2 is a schematic end view of a stripe geometry junction laser in accordance with an illustrative embodiment of our invention.

With specific reference now to FIG. 2, our invention is a semiconductor device comprising a semiconductor body 100, a metallic electrical contact 110 formed on a major surface of body 100, a pair of laterally separate, high resistivity zones 120 within the body which constrain current to flow in a narrow channel 130. A low resistivity zone 140 separates the high resistivity zones 120 from contact 110. Accordingly, current depicted by arrows 150 flows into the low resistivity zone 140 of body 100 over an area which is much larger than the area defined by the narrow channel 130. Once inside the low resistivity zone 140, current flows laterally as well as vertically to reach the channel. But the current density at the interface between zone 140 and contact 110 is much lower than that of the prior art laser of FIG. 1. Accordingly, it is easier to fabricate good quality contacts 110.

In a laser zone 126 depicts the active region which includes a p-n junction. The pumping current 150 generates laser radiation therein by the recombination of holes and electrons. Although the high resistivity zones 120 are shown to extend through active zone 126, it is sufficient if they merely extend near to that zone.

Example: Laser EF-1099

This example describes the fabrication of a stripe geometry, proton bombarded, GaAs-AlGaAs DH junction laser in accordance with an illustrative embodiment of our invention.

With reference to FIG. 2, the laser comprised an n-GaAs substrate 101 doped with Si to about $1-3 \times 10^{18}$/cm$^3$. Using liquid phase epitaxy, we grew the following layers on the substrate in the order recited: an n-$Al_{.36}Ga_{.64}As$ cladding layer 102 doped with Te to about $1 \times 10^{17}/cm^3$ and about 1.6–3.6 μm thick; a p-$Al_{.08}Ga_{.92}As$ active layer 103 doped with Ge to about $2 \times 10^{18}/cm^3$ and about 0.14–0.38 μm thick; and a p-$Al_{.36}Ga_{.64}As$ cladding layer 104 doped with Ge to about $4 \times 10^{17}/cm^3$ and about 1.9–3.4 μm thick. The optional p-GaAs cap layer alluded to with reference to FIG. 1 was not utilized. The thickness ranges given for each of the layers represent thickness variations across the wafer, and not variations within single chips.

Following the completion of epitaxial growth, we reversed the standard sequence of two process steps by performing proton bombardment before Zn diffusion. Specifically, the wafer was suitably masked, typically by means of a prewound grid of thin wires, to define the stripe regions 130 (only one is shown in FIG. 2). Then the upper surface of the epitaxial layer 104 was subjected to a proton bombardment dosage of 300 keV and a flux density of $3 \times 10^{15}/cm^2$. This produced crystal damage, and hence high resistivity, which extended from the upper surface of layer 104 down to a depth of approximately 2.4 μm (near to and preferably through the p-n junction between layers 102 and 103). The resulting stripe-like channel 130 was about 12 μm wide. Next, Zn was diffused into the top surface of layer 104 from a GaAs:$ZnAs_2$ (1400:800) source for 25 minutes at 620° C. in an open boat diffusion furnace. This step produced a low resistivity zone 140 to a depth of about 1.1 μm in the AlGaAs layer 104 and a carrier concentration of about $1 \times 10^{20}/cm^3$.

Contacts were then deposited as follows: the contact to p-AlGaAs layer 104 comprised a layer of Ti about 1,000 Å thick and a layer of Pt about 1500 Å thick; and the contact (not shown) to substrate 101 comprised an alloyed composition of Sn, Pd, and Au, respectively 1,000 Å, 1,000 Å, and 4,000 Å thick.

The lasers which resulted from this fabrication technique were very satisfactory and possessed low forward resistances consistent with high lateral conductivity in the Zn diffused region 140. Lasers from this wafer had forward resistances in the range of 1.0–1.4 Ω and forward voltages in the range of 1.53–1.57 V. Since the lasers were 380 μm long and had 12 μm stripes, the specific resistivity was in the range of about $4.5$–$6.4 \times 10^{-5}$ Ω $cm^2$, as desired.

When bonded to a suitable heat sink, the lasers were operated c.w. at room temperature at an average threshold current of about 120 mA and an average wavelength of about 8270 Å.

Figure 3:
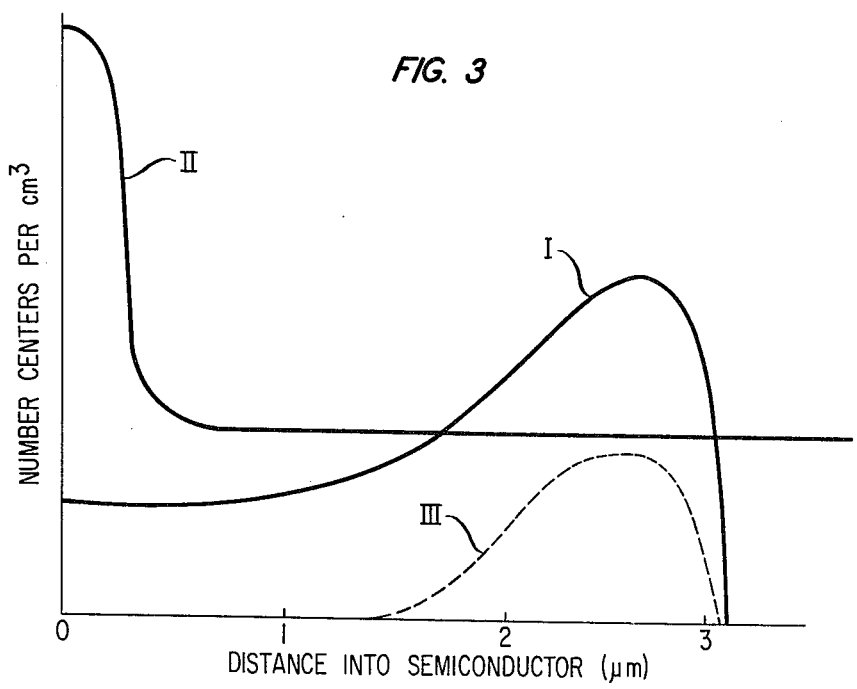
FIG. 3 is a graph of doping and proton damage profiles useful in understanding one of the techniques for fabricating the junction laser of FIG. 2. The ordinate gives the number of centers per cm$^3$; i.e., the number of damage centers for proton bombardment curve I and the number of Zn acceptors for diffusion curve II.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, another method for achieving the buried high resistivity zones 120 of FIG. 2, which we have not yet confirmed experimentally but which we believe to be feasible, makes use of the special properties of proton bombardment damage as a function of distance into a body of semiconductor material. As shown in FIG. 3, curve I, this damage becomes greater as the end-of-range is approached (as the protons are reduced to thermal energy). In FIG. 3 zero on the abscissa represents the proton bombarded surface (i.e., the uppermost epitaxial surface), and the peak of curve I at about 2.7 μm should be in the vicinity of the p-n junction of a typical DH laser. We propose that, even if proton bombardment is done after Zn diffusion, as in standard procedures, significant conductivity can remain in the Zn-diffused region 140 of FIG. 2 after bombardment. To do so requires that the damage profile of curve I and the doping profile of curve II be suitably tailored so as to produce a final resistivity profile depicted by curve III for the buried high resistivity zones 120. Our analysis indicates that two factors may be important: (1) The proton dose should be reduced below standard levels by a factor of about 2 to 10. It is known that the standard dose is higher than necessary to produce adequate current confinement and results in more damage, especially near the upper surfaces, than is necessary; and (2) the proton bombardment should be done prior to forming metallic contacts. We conjecture that contact metals have the property of thermalizing a significant fraction of the incident protons so that damage by these protons in the material immediately under the upper surface is much greater than it would be if the metals were absent at the time of proton bombardment. It should be noted that this technique would be useful regardless of whether the high conductivity zone 140 is obtained by acceptor diffusion (e.g., Zn diffusion) or whether it is part of the as-grown epitaxial layer 104 (e.g., heavily doped with Ge, U.S. Pat. No. 3,914,785 issued to D. R. Ketchow on Oct. 21, 1975).

What is claimed is:

1. In a double heterostructure semiconductor junction laser, a structure comprising:
    a semiconductor body including a pair of opposite conductivity type AlGaAs cladding layers; and a narrower bandgap $Al_zGa_{1-z}As$ ($0 \leq z \lesssim 0.4$) active region bounded by said layers;
    an electrical contact to a p-type major surface of said body for applying forward-bias pumping current to said active region;
    a low resistivity, stripe-like channel through which said current flows from said contact to said active region, thereby to cause recombination of holes and electrons and the emission of stimulated radiation from said active region;
    a pair of laterally spaced, higher resistivity proton bombarded zones which bound said channel and constrain said current to flow through said channel characterized in that a Zn diffused semiconductor zone, wider than said channel, separates said contact from said higher resistivity zones and has a lower resistivity than said latter zones so that current from said contact spreads into a semiconductor area wider than said channel before entering said channel and further characterized in that said structure is fabricated by a process which includes the steps of epitaxially growing said active region and cladding layers, selectively proton bombarding the uppermost epitaxial surface down to a depth of approximately said active region to form said higher resistivity proton bombarded zones, and then diffusing Zn atoms into said surface to form said Zn diffused semiconductor zone.

2. The structure of claim 1 wherein said Zn diffused semiconductor zone is diffused with about $10^{20}$ Zn atoms/$cm^3$.

3. The structure of claim 2 wherein Zn is diffused from a GaAs:$ZnAs_2$ source for about 25 minutes at 620° C.

4. The structure of claim 2 wherein Zn is diffused to produce said Zn diffused semiconductor zone to a depth of about 1.1 μm.

5. The structure of claim 2 wherein said proton bombarding is with 300 keV protons at a flux density of about $3 \times 10^{15}/cm^2$.

* * * * *